United States Patent [19]
Powell et al.

[11] Patent Number: 6,014,336
[45] Date of Patent: Jan. 11, 2000

[54] TEST ENABLE CONTROL FOR BUILT-IN SELF-TEST

[75] Inventors: Theo J. Powell, Dallas, Tex.; Kuong Hua Hii, Singapore, Singapore; Danny R. Cline, Plano, Tex.

[73] Assignee: Texas Instruments Incorporated, Dallas, Tex.

[21] Appl. No.: 09/005,081

[22] Filed: Jan. 9, 1998

Related U.S. Application Data

[63] Continuation-in-part of application No. 08/846,922, Apr. 30, 1997, Pat. No. 5,883,843.

[51] Int. Cl.⁷ .................................................. G11C 7/00
[52] U.S. Cl. ........................ 365/201; 365/201; 371/21.1
[58] Field of Search ................................. 321/10.1, 10.2, 321/22.3, 22.4; 365/200

[56] References Cited

U.S. PATENT DOCUMENTS

| | | | |
|---|---|---|---|
| 5,210,864 | 5/1993 | Yoshida | 395/575 |
| 5,224,103 | 6/1993 | Ligthart et al. | 371/22.4 |
| 5,479,414 | 12/1995 | Keller et al. | 371/22.3 |
| 5,633,813 | 5/1997 | Srinivasan | 364/578 |
| 5,758,058 | 5/1998 | Milburn | 395/182.09 |
| 5,883,843 | 3/1999 | Hii et al. | 365/201 |

*Primary Examiner*—Viet Q. Nguyen
*Attorney, Agent, or Firm*—Robby T. Holland; Richard L. Donaldson

[57] ABSTRACT

A test enable control for a built-in self-test of a memory device is provided. In one embodiment of the present invention, a test enabling system is provided. The test enabling system comprises an enable test circuit (62), a plurality of test algorithms stored in a read only memory (72) and a program counter (66) operable to control the execution of the test algorithm. The first instruction of each test is a jump test enable instruction (130) comprising a jump test instruction and an address in the read only memory (72) corresponding to the next test algorithm. The enable test circuit (62) is operable to signal to the program counter (66) if a particular test algorithm is enabled.

55 Claims, 3 Drawing Sheets

FIG. 3

| READ | WRITE | X | Y | | TEST1 | TEST2 | TSET0 | TSET1 | DATA | ED | CKBD | ALT |
|---|---|---|---|---|---|---|---|---|---|---|---|---|
| 1 | 0 | 1 | 1 | | 0 | 0 | 0 | 1 | 0 | 0 | 0 | 0 |

ARRAY ACCESS — 140
PROGRAM CONTROL — 142

FIG. 4

| READ | WRITE | XEN | YEN | | TEST1 | TEST0 | TSET0 | D5 | D4 | D3 | D2 | D1 | D0 | ROM PROGRAM ADDRESS |
|---|---|---|---|---|---|---|---|---|---|---|---|---|---|---|
| 0 | 0 | 0 | 0 | | 0 | 0 | TSET0 | D5 | D4 | DAT | ED | CKB | ALT | ∧ |
| 0 | 0 | 0 | 0 | | 0 | 0 | | | | | | | | ∨ |

PROGRAM CONTROL
ARRAY ACCESS
JUMP TEST ENABLE

| 176 BA1 | 174 BA0 | 172 A11 | 170 A10 | 168 A9 | 166 A8 | 164 A7 | 162 A6 | 160 A5 | 158 A4 | 156 A3 | 154 A2 | 152 A1 | 150 A0 |
|---|---|---|---|---|---|---|---|---|---|---|---|---|---|
| INT/EXT CLK | SUB-ARRAY | OUTPUT ENABLE | READ ONE COLUMN | WRITE ONE ROW | BURN IN | PAGE DISTURB | LONG DISTURB | SHORT DISTURB | OVER VOLTAGE | YMARCH | XMARCH | PAUSE | GROSS |
| | | 118 | 116 | 114 | 112 | 110 | 108 | 106 | 104 | 102 | 100 | | |

— 148

TEST ENABLE CONTROL FOR BUILT-IN SELF-TEST

RELATED APPLICATIONS

This application is a continuation-in-part application of pending U.S. patent application Ser. No. 08/846,922, filed Apr. 30, 1997, now U.S. Pat. No. 5,883,843, assignee to the same party.

TECHNICAL FIELD OF THE INVENTION

This invention relates to the field of built-in self-tests for memory systems and more specifically to a test enable control for built-in self-test.

BACKGROUND OF THE INVENTION

In conventional testing of memory device, an external tester supplies control signals such as column address (CAS), row address (RAS), write enable (WE), address signals, and data to the device under test. Outputs from the device under test are sampled by the tester to determine whether the device passes or fails. As memory device density increases, testing time also increases. This increased testing time increases the manufacturing cost of integrated circuit memory devices.

In order to decrease the time it takes to test high density memory devices, parallel read and write schemes have been implemented. One drawback of implemented parallel read and write schemes is that an external tester is required. Also, parallel leads required to test the memory devices in parallel occasionally fail due to cross talk among the leads.

To avoid the drawbacks of parallel read and write schemes, built-in self-test arrangements have been used. The built-in self-test arrangement includes a read only memory that stores test algorithm instructions. The read only memory eliminates the need for external testers as well as parallel leads. Many different types of tests have been proposed for built-in self-test arrangements. However, these schemes lack the ability to choose what tests will be run and what test need not be run. Therefore, it is desirable to have a built-in self-test technique that allows for selection of self-tests for execution.

SUMMARY OF THE INVENTION

Accordingly, it may be appreciated that a need has arisen for a test enable control for a built-in self-test of a memory device. In accordance with the present invention, a test enable control for a built-in self-test of a memory device is provided which substantially eliminates or reduces disadvantages and problems associated with current self-test schemes.

In one embodiment of the present invention, a test enabling system is provided. The test enabling system comprises an enable test circuit, a plurality of test algorithms stored in a read only memory and a program counter operable to control the execution of the test algorithm. The first instruction of each test is a jump enable instruction comprising a jump test instruction and a read only memory address corresponding to the next test algorithm. The enable test circuit is operable to signal to the program counter if the test algorithm is enabled.

The present invention provides various technical advantages over current self-test schemes. For example, one technical advantage is the ability to selectively chose what test to run. Another technical advantage is the ability to perform tests without external testing equipment. Other technical advantages may be readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, in which like reference numbers represent like parts, in which:

FIG. 3 illustrates the types of instructions for test algorithms;

FIG. 4 illustrates a jump test enable instruction; and,

FIG. 5 illustrates the selection of algorithms in the enabled test circuit.

DETAILED DESCRIPTION OF THE INVENTION

Figure 1:
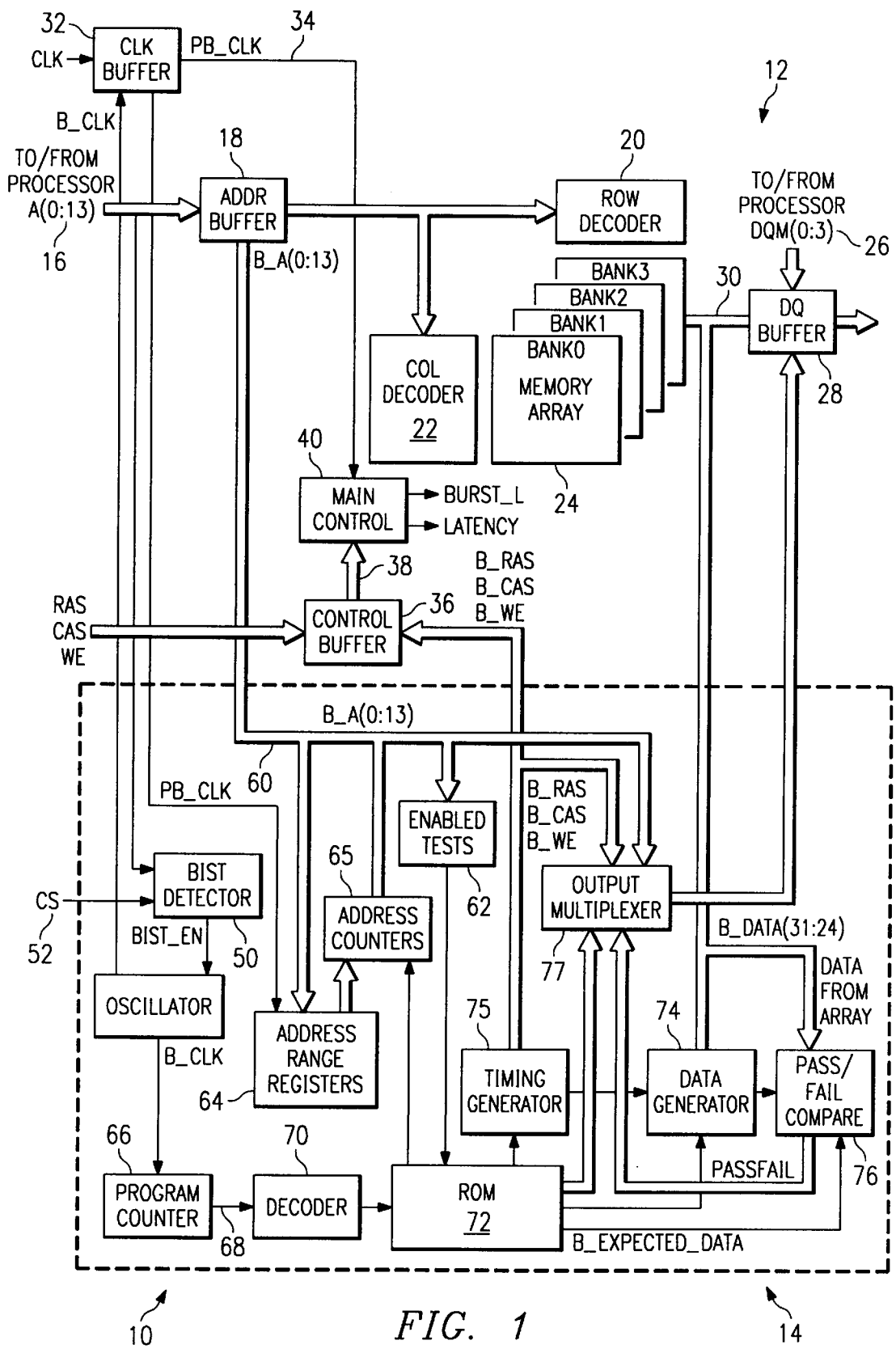
FIG. 1 illustrates a synchronous dynamic random access memory (SDRAM) with a built-in self-test device.

FIG. 1 illustrates a synchronous dynamic random access memory (SDRAM) 10 with built-in self-test device 10 in accordance with the teachings of the present invention. SDRAM 10 comprises a conventional memory 12 and a built-in self-test arrangement 14.

Conventional memory 12, in one embodiment, operates as a conventional synchronous dynamic random access memory during normal operation. In test operations, built-in self-test arrangement 14 operates in a self-test mode. All test signals are generated internally to SDRAM 10.

In normal mode, conventional memory 12 operates like a well-known synchronous dynamic random access memory device. A digital processor, such as a microprocessor (not shown) produces row and column address. The row and column addresses are provided on an address bus 16 in a time division multiplexed format for storage in an address buffer 18. After receiving a control signal from the digital processor, the row address and column address are decoded either by row decoder 20 or column decoder 22.

Depending upon the state of the write enable signal, WE, from the digital processor, data is either written into or read out from storage cells located in the banks of a memory array 24. Data which is written into memory array 24 is entered by way of data bus 26. In-coming data is buffered in a data buffer 28 and forwarded to memory array 24 by an internal data bus 30 where it is stored until it is written over or not properly refreshed. Data stored in memory array 24 can be addressed and read out of memory array 24 via internal data bus 30 and data buffer 28 to data bus 26. Typically, data bus 26 is connected to the data receiving and sending terminals of a digital processor such as a microprocessor.

Conventional memory 12, in one embodiment, is a synchronous dynamic random access memory and therefore relies on a system clock for synchronizing its operation with the digital processor, peripheral devices, and control circuitry connected to SDRAM 10. A clock signal CLK is applied to a clock buffer 32 which outputs an internal clock signal 34 for operating memory array 24 during normal operation.

The digital processor applies control signals CAS, RAS, and WE to a control signal buffer 36. During normal operation, these control signals pass through control buffer 36, over to a control bus 38 to a main control unit 40 or for access to memory array 24 through row decoder 20 and column decoder 22. During normal operations, internal system clock signal 34 and the control signals control operation of memory array 24.

The self-test mode is entered if special signal conditions are applied at power up of SDRAM 10. Typically, to initiate the self-test mode, a DC signal will be applied externally to SDRAM 10. In one example, an overvoltage signal to a specific address pin (such as pin A4) of SDRAM would place SDRAM 10 in a self-test condition. Once an overvoltage is applied to a specific pin, a built-in self-test detector circuit 50 responds to this overvoltage by placing built-in self-test arrangement 14 into the self-test mode.

In the self-test mode, built-in self-test arrangement 14 prepares for testing by gathering information on what test to run. The self-test mode is exited when another input is applied to an address lead. In one embodiment, that input applies a high level to control signal 52 (CS) at built-in self-test detector circuit 50. In this embodiment, the self-test mode will be active as long as control signal 52 remains at a high level state. Once control signal 52 falls to a low level state, the self-test mode is exited. Further description of the arrangement and operation of built-in self-test detector 50 can be found in copending U.S. application Ser. No. 08/840,428 entitled 'Procedures For entry to an Exit From a Built-In-Self-Test Unit in a Semiconductor Memory' now abandoned (TI-22640), hereby incorporated by reference herein.

Upon entering the self-test mode, built-in self-test detector 50 sends a BIST_EN signal to an oscillator 58. In response to the BIST_EN signal, oscillator 58 generates a clock signal B_CLK that is applied to a clock buffer 32 in order to take control of clock buffer 32. Alternatively, an external clock scheme may be used. The internal/external clock option is discussed in copending U.S. application Ser. No. 09/004,998 entitled 'Internal/External Clock Option for Built-In Self-Test' now U.S. Pat. No. 5,875,153 assigned to Texas Instruments (TI-23099), which is hereby incorporated by reference herein.

When in the self-test mode, data from address buffer 18 is transferred via internal address bus 60 to an enabled test circuit 62. Enabled test circuit 62 is a shift register that stores data identifying a specific test, or group of tests, to be run during the self-test mode. Once the selected test data is stored in enabled test circuit 62, a group of addresses may be stored in an address range register 64. Address data can then be tracked using address counter 65.

Also included is a program counter 66 operable to control test sequences. Upon initiation of self-test mode, program counter 66 is reset to its zero state by clock signal B_CLK. Program counter 66 is a sequential logic arrangement in which the next state of program counter 66 is determined by a current state of program counter 66 and the state of data furnished by a Read-only-Memory (ROM) register.

A Read only Memory decoder 70 receives binary signals from program counter 66 via a bus 68. The binary signals are decoded by ROM address decoder 70. In one embodiment, a one out of sixty-four code technique is used to select a row of data from a read only memory 72. In one embodiment, ROM 72 is a sixty-four row read only memory that stores sequences of instruction for controlling routines. In one embodiment, ten test algorithms are stored in ROM 72. Each row address applied form ROM address decoder 70 to ROM 72 accesses a row of data stored therein in response to clock signal B_CLK. One row of data typically makes up one instruction of an algorithm. It is in one of these instructions that a mask release number for SDRAM 10 is stored.

Instructions are outputted from ROM 72 to a data generator 74 which generates the data to be written to or read from memory array 24. A pass/fail circuit 76 compares the data from memory array 24 with the expected data from ROM 72 and data generator 74. When expected data is equivalent to the data from memory array 24, a pass signal is generated. If not, a fail signal is generated. Fail signals are stored in a register (not pictured) and conveyed through data buffer 28 where the results can be read off a pin of SDRAM 10.

Additionally, instructions from ROM 72 are received by timing generator 75 which generates self-test signals such as B_RAS, B_CAS and B_WE, which are the internally generated equivalent of RAS, CAS, and WE. B_CAS, B_RAS and B_WE instructions pass to control signal buffer 36 when in self-test mode. Output multiplexer 77 takes data involving DRAM addresses, control signals, clock information, and data from pass/fail circuit 76 and presents it to DQ buffer 28.

Figures 2, 6:
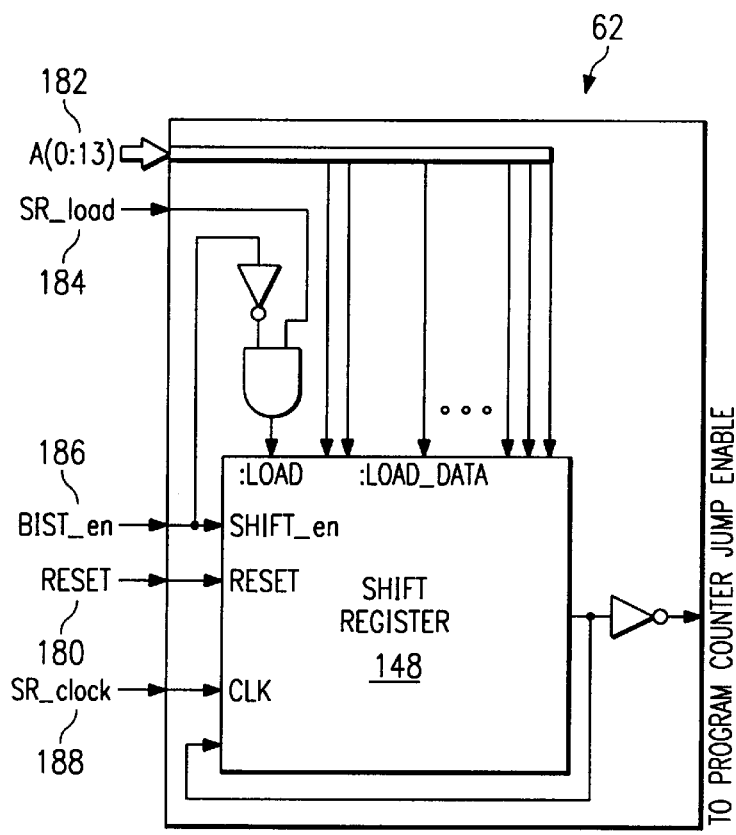
FIG. 2 illustrates read only memory addresses and the corresponding self-tests.
FIG. 6 illustrates the test enable circuit.

FIG. 2 illustrates read only memory 72 addresses and the corresponding self-tests. In the illustrated embodiment, a total of ten self-tests are provided. In this embodiment, a gross test 100 occupies ROM 72 address 000000 to 000011. Gross test 100 is a write and read test from a full array. A pause test 102 occupies address 000100 to 001000. Pause test 102 tests for data retention. An Xmarch test 104 occupies address 001010 to 010000. Xmarch test 104 writes to one column at a time until the entire memory array 24 is filed. A Ymarch test 106 occupies address 010001 to 010111. Ymarch test 106 writes to one row at a time until the entire memory array 24 is filed. A short disturb test 108 occupies address 011000 to 100001. Short disturb test 108 tests adjacent rows using a disturb algorithm having short cycle timing. Further details of short disturb test can be found in copending U.S. application Ser. No. 09/004,996 entitled 'Short Disturb Test Algorithm for Built-In Self-Test ' (TI-19734) which is hereby incorporated by reference herein. A long disturb 110 occupies address 100010 to 101011. Long disturb test 110 tests adjacent rows using a disturb algorithm having long cycle timing. A page disturb test 112 occupies address 101100 to 110110. Page disturb test 112 tests adjacent rows in a page mode. A burn in test 114 occupies addresses 110111 to 111010. Burn in test 114 does a full array burn in. Further details of burn in test 114 can be found in copending U.S. application Ser. No. 09/004,973 entitled 'Burn-In Scheme for Memory Systems with Built-In Self-Test ' (TI-23823) which is hereby incorporated by reference herein. A write one row test 116 occupies address 111011 to 111100. This test writes to one row. A read one column test 118 occupies address 111101 to 111110. Read one column test 118 reads data from one column. Finally, address 111111 is the end of the self-tests and contains an idle instruction 120 as well as the mask release number for SDRAM device.

FIG. 3 illustrates the types of instructions for the various self-tests. Two major types of instructions exist. The first of the instruction types are program control instructions 142 and the second of the instruction types are array access instructions 140. Program control instructions 142 control the operation of the built-in self-test while array access instructions 140 determine how cells of memory array 24 are to be accessed and written to and/or read from. In one embodiment, both are twelve bit instructions. In array access instructions 140, Read is a command to read a cell, Write is a command to write to a cell, X determines if columns are to be accessed, Y determines if rows are to be accessed, Tset 0 and Tset 1 set the timing of the self-test, Dat determines what data is to be used, ED is the expected data, Ckbd sets the pattern to be read or written, and Alt determines if the address is to be incremented or decremented. For example, if an array access instruction 140 of 101100010000 is given, that would correspond to read X and Y using a specific time set with an expected data of 0.

For program control instructions 142, the first six bits list an instruction and the last six bits are a ROM 72 address. The first four bits of the first six bits are typically 0, and the next two determine the program control type, while the last six bits determine the ROM 72 address to jump to if the first six bits require a jump. The very last instruction in ROM 72 is idle instruction 120 which signals the end of the built-in self-test. For example, idle instruction 120 is 010011 for the first six bits. When this instruction is reached, the built-in self-test is over and the program control sits at an idle state until built-in self-test is exited and normal mode resumes. Since an idle instruction logically does not require a jump, the last 6 bits are unused. Thus, the last six bits of idle instruction 120 may be used in any manner such as for storing the mask release number for SDRAM 10. Further details of storing mask release numbers can be found in copending U.S. application Ser. No. 09/005,539 entitled 'ROM Embedded Mask Release Number for Built-In Self-Test ' (TI-23015) which is hereby incorporated by reference herein.

FIG. 4 illustrates a jump test enable instruction 130. Jump test enable instruction 130 is a program control instruction 142 and is the first instruction of any test algorithm. When this instruction is reached, test enable circuit 62 is checked to see if the test is enabled. If it is, the test is performed. If not, program control jumps to the row address stored in the second six bits. In one embodiment, the first six bits of jump test enable instruction is 000000.

FIG. 5 illustrates the selection of algorithms in the enabled test circuit 62. In one embodiment, enabled test circuit 62 comprises a fourteen bit shift register 148. Address A0 150 is the address for gross test 100. Address A1 152 is the address for pause test 102. Address A2 154 is the address for X March test (Xmarch)104 and Address A3 156 is the address for the Y march (Ymarch) test 106. For addresses A0 to A3, a one placed in that register indicates that test is to be performed and a zero indicates the test is not to be performed. Address A4 158 is the over voltage address. As discussed earlier, a high value on the over voltage address places device 10 into self-test mode. Address A5 160 is the address for short disturb test 108. Address A6 162 is the address for long disturb test 110. Address A7 164 is the address for page disturb test 112. Address A8 166 is the address for burn-in test 114. Burn-in test 114 is further described in copending U.S. application Ser. No. 09/004,973 entitled 'Burn-In Scheme for Memory Systems with Built-In Self-Test' (TI-23823). Address A9 168 is the address for write one row test (W1R). Address A10 170 is the address for read one column test (R1C) 118. For addresses A5 to A10, a one in the address will indicate that the test is to be performed and a zero indicates that the test is to be skipped. Address A11 172 is the address for output enable. Output enable is useful after the built-in self-test is completed. Address BA0 174 is the address for subarray testing of memory array 24. A one in this address indicates that only a subarray of memory array 24 is to be tested. A zero indicates a full array is to be tested. Address BA1 176 is the address for internal/external clock selection. A one in address BA1 selects an external clock and a zero selects an internal clock. The internal/external clock option is discussed in further detail in copending U.S. application Ser. No. 09/004,998 entitled 'Internal/External Clock Option for Built-In Self-Test' now U.S. Pat. No. 5,875,153 assigned to Texas Instruments Incorporated (TI-23099).

At power-up, a one is loaded into the test addresses (A0 to A3 and A5–A10) that are to be run and a zero into a test address of a test that is to be skipped.

FIG. 6 illustrates the test enable circuit 62. Test enable circuit 62 comprises a shift register 148 which is loaded via an address input 182. At power-up, a reset signal 180 clears shift register 148. When BIST_en signal 186 is 0, data may be inputted into shift register 148 via address input 182 at the time SR_Load signal 184 goes high. When BIST_en signal 186 goes high, shift register 148 acts as a circular shift register where the least significant register (or most significant register depending on how mapping occurs) is feeding an input to program counter 66.

As discussed in conjunction with FIG. 3, each test algorithm has an initial jump test enable instruction 130. When program counter 66 reaches the beginning of a particular test algorithm and its jump test enable instruction 130, the output of test enable circuit 62 is checked. If the least significant bit (or most significant bit depending on the embodiment) is a zero ("0") then that particular test algorithm is skipped. A load program counter signal is sent to program controller 66 and the program controller will skip the current test and jump to the test at the address listed with in jump enable instruction 130. If the least significant bit is one ("1"), the particular test algorithm will be run. An increment program counter message is sent to program counter 66 and the next instruction of the test algorithm is run.

After a jump test enable instruction 130 is executed, SR_Clock 188 is pulsed. This causes all bits to shift to the right in shift register 148. This prepares shift register 148 for the next text algorithm.

Therefore, in operation, it is first determined if a particular test is to be run by checking the proper address in enable test circuit 62. Since enable test circuit 62 is a shift register and is synchronized with the list of instruction in ROM 72, the first test is checked against the least significant bit in enable test circuit 62. If that bit is a zero, program flow jumps to the second test and data in the shift register 148 of enable test circuit 62 shifts to the right. The second test is run depending on the new contents of the least significant bit of enable test circuit 62. This process continues until the first high level one enable test signal is received. Program flow jumps to the test algorithm corresponding to a high level one enable test signal and performance of the test algorithm begins. Then, that test executes. After execution of the test, program flows drops to the next test algorithm and that test is checked against the shifted data in enable test circuit 62.

Thus, it is apparent that there has been provided, in accordance with the present invention, a test enable control for a built-in self-test of a memory device that satisfies the advantages set forth above. Although the present invention has been described in detail, it should be understood that various changes, substitutions, and alterations may be readily ascertainable to those skilled in the art and may be made herein without departing from the spirit and scope of the present invention as defined by the following claims.

What claimed is:

1. A system for enabling tests as part of a built-in self-test arrangement on an integrated circuit comprising:
   an enable test circuit;
   a read only memory operable to store a plurality of test algorithms;

wherein the enable test circuit contains data separately indicating whether each of the first plurality of test algorithms stored in the read only memory array is enabled.

2. The system of claim 1, wherein the enable test circuit comprises a multibit shift register and wherein each bit of the multibit shift register corresponds to one of the test algorithms.

3. The system of claim 2, wherein a first value stored in a bit of the multibit shift register indicates that a test is to be run while a second value stored in a bit of the multibit shift register indicates that a test is to be skipped.

4. The system of claim 1, wherein the first instruction of each of the plurality of test algorithm is a jump enable instruction comprising a jump test instruction and a read only memory program address.

5. A test enabling system comprising:
   an enable test circuit;
   a plurality of test algorithms stored in a read only memory and wherein the first instruction of each test algorithm is a jump test enable instruction comprising a jump test instruction and a read only memory address corresponding to the next test algorithm; and
   a program counter operable to control the execution of the test algorithms;
   wherein the enable test circuit is operable to indicate to the program counter if the test algorithm is enabled.

6. The system of claim 5, wherein the program counter jumps to the read only memory address corresponding to the next test algorithm if the test algorithm is not enabled.

7. The system of claim 5, wherein the program counter moves to the next instruction of the test algorithm if the test algorithm is enabled.

8. The system of claim 5, wherein the enable test circuit comprises a multibit shift register and wherein each bit of the multibit shift register corresponds to one of the test algorithms.

9. A test enable circuit for a built-in self-test comprising:
   a multibit shift register;
   a shift register load input;
   a built-in self-test enable signal input;
   a reset signal input; and,
   a shift register clock signal input;
   wherein each bit in the multibit shift register corresponds to a test algorithm to be run on a memory array, the value of the bit in the multibit shift register determining whether the test will be run.

10. The circuit of claim 9, wherein a high shift register load signal supplied to the shift register load input is operable to allow the bits of the multibit shift register to be loaded with data.

11. The circuit of claim 9, wherein a one loaded into a bit corresponding to a test algorithm indicates that the test will be run while a zero loaded a bit corresponding to a test algorithm indicates the test will be skipped.

12. The circuit of claim 9, wherein a high reset signal applied to the reset signal input resets the multibit shift register.

13. The circuit of claim 9, wherein a high built-in self-test signal supplied to the built-in self-test input starts the multibit shift register.

14. The circuit of claim 9, wherein a pulse from shift register clock signal applied to the shift register clock signal input causes the bits in the multibit shift register to shift one place.

15. The system of claim 1, wherein the enable test circuit and the read only memory are part of a built-in self-test arrangement on a memory device.

16. The system of claim 15, wherein the memory device is a synchronous memory device.

17. The system of claim 16, wherein the memory device is a dynamic random access memory (DRAM) device.

18. The system of claim 15, wherein the memory device is a dynamic random access memory (DRAM) device.

19. The system of claim 1, wherein the enable test circuit comprises a plurality of storage locations, and wherein each of the plurality of storage locations includes one bit of information corresponding to a separate one of the test algorithms stored in the read only memory device.

20. The system of claim 19, wherein the plurality of the storage locations of the enable test circuit corresponding to the test algorithms stored in the read only memory device are loaded by data applied to external terminals of the integrated circuit.

21. The system of claim 15, wherein the enable test circuit comprises a plurality of storage locations, and wherein each of the plurality of storage locations contain one bit of information corresponding to a separate one of the test algorithms stored in the read only memory device.

22. The system of claim 21, wherein the plurality of the storage locations of the enable test circuit corresponding to the test algorithms stored in the read only memory device are loaded by data applied to external terminals of the integrated circuit.

23. The system of claim 22, wherein the external terminals of the integrated circuit are address terminals.

24. The system of claim 23 further including an address buffer circuit connected between the address terminals of the integrated circuit and the enable test circuit.

25. The system of claim 21 wherein the storage locations of the enable test circuit form part of a shift register.

26. The system of claim 15, wherein the integrated circuit is operated in two separate modes, normal mode and test mode respectively, and wherein the test mode is entered by applying at least one test signal to at least one external terminal of the integrated circuit.

27. The system of claim 26, wherein the at least one test signal is an overvoltage signal and the at least one external terminal of the integrated circuit is an address pin.

28. The system of claim 18, wherein one of the plurality of test algorithms is a burn in test algorithm.

29. The system of claim 18, wherein one of the plurality of test algorithms is a disturb test algorithm.

30. The system of claim 1, wherein the first instruction of each test algorithm causes the enable test circuit to be checked to determine if the test algorithm is enabled.

31. The system of claim 1, wherein the first instruction of each test algorithm is a jump test enable instruction comprising a jump test instruction and a read only memory address corresponding to the next test algorithm stored in the read only memory.

32. The system of claim 31, wherein the jump test enable instruction of each test algorithm causes the enable test circuit to be checked to determine if the test algorithm is enabled.

33. The system of claim 32, further comprising a program counter, and wherein when the jump test enable instruction is reached for a given test algorithm, the program counter jumps to the read only memory address corresponding to the next test algorithm if the given test algorithm is not enabled.

34. The system of claim 32, further comprising a program counter, and wherein when the jump test enable instruction is reached for a given test algorithm, the program counter moves to the next instruction of the given test algorithm if the test algorithm is enabled.

35. A method of testing an integrated circuit comprising:

programming a plurality of test algorithms in a nonvolatile memory located on the integrated circuit;

loading a plurality of storage locations located on the integrated circuit with data, each storage location corresponding to one of the plurality of test algorithms in the nonvolatile memory and indicating whether the corresponding test algorithm is enabled;

checking the storage locations to determine if the test algorithm currently being considered is enabled;

performing the test algorithm if the test algorithm is enabled.

36. The method of claim 35, wherein the nonvolatile memory is a read only memory.

37. The method of claim 35 further comprising the step of jumping to the next test algorithm if the test algorithm is not enabled.

38. The method of claim 35, wherein the integrated circuit is a memory device.

39. The method of claim 38, wherein the step of loading a plurality of storage locations with data comprises placing the data on address pins of the integrated circuit.

40. The method of claim 38, further comprising the step of loading addresses in an address range register.

41. The method of claim 38, wherein the data loaded into the plurality of storage locations further includes information indicating what portion of the memory device is to be tested.

42. The method of claim 35, wherein the data loaded into the plurality of storage locations further includes information indicating whether an internal clock or an external clock will be used during the test operation.

43. A built-in self-test circuit located on a memory device comprising:

a nonvolatile memory having a plurality of test algorithms stored therein;

an enable test circuit connected between address terminals of the memory device and the nonvolatile memory, the enable test circuit storing information indicating which of the test algorithms stored in the nonvolatile memory are enabled.

44. The memory device of claim 43, wherein the nonvolatile memory is a read only memory.

45. The memory device of claim 43, wherein the enable test circuit includes a plurality of storage locations each containing information corresponding to a separate one of the test algorithms stored in the nonvolatile memory array and indicating whether the corresponding one test algorithm is enabled.

46. The memory device of claim 43, wherein the enable test circuit is loaded by data placed on external address terminals of the memory device.

47. The memory device of claim 43, wherein the memory device is capable of operating in either a test mode or a normal mode, and wherein the test mode is entered by placing a special signal on at least one of the address terminals of the memory device.

48. The memory device of claim 47, wherein the special signal is an overvoltage signal.

49. The memory device of claim 43, wherein the enable test circuit is a shift register, and wherein the data in the shift register is shifted after the enable test circuit is checked to determine if the corresponding test algorithm in the nonvolatile memory is enabled.

50. The memory device of claim 43, wherein the memory device includes a memory array subdivided into a plurality of subarrays, and wherein the enable test circuit further includes at least one storage location indicating what portion of the memory array is to be tested.

51. The memory device of claim 43, wherein one of the plurality of test algorithms is a burn in test algorithm.

52. The memory device of claim 43, wherein one of the plurality of test algorithms is a disturb test algorithm.

53. The memory device of claim 43, wherein the first instruction of each test algorithm causes the enable test circuit to be checked to determine if the test algorithm is enabled.

54. The memory device of claim 43, wherein the memory device is a synchronous memory device.

55. The memory device of claim 54, wherein the memory device is a dynamic random access memory (DRAM) device.

* * * * *